(12) United States Patent
Ohishi et al.

(10) Patent No.: US 7,010,378 B2
(45) Date of Patent: Mar. 7, 2006

(54) COMPONENT AND MATERIAL TRACEABILITY CONTROL APPARATUS, CONTROL METHOD, CONTROL PROGRAM, AND CONTROL PROGRAM MEMORY MEDIUM

(75) Inventors: Satoshi Ohishi, Chiyoda-ku (JP); Kazuo Hara, Chiyoda-ku (JP); Yoshifumi Morioka, Chiyoda-ku (JP); Katsumi Otani, Chiyoda-ku (JP); Makoto Kogai, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/046,589

(22) Filed: Jan. 28, 2005

(65) Prior Publication Data

US 2006/0020361 A1  Jan. 26, 2006

(30) Foreign Application Priority Data

Jul. 26, 2004  (JP) .............................. 2004-217240

(51) Int. Cl.
G06F 19/00 (2006.01)
G06F 17/30 (2006.01)

(52) U.S. Cl. ................................... 700/115; 707/104.1
(58) Field of Classification Search .......... 700/99–102, 700/115, 116, 213–226; 707/100, 102, 104.1
See application file for complete search history.

(56) References Cited

U.S. PATENT DOCUMENTS

| | | | | |
|---|---|---|---|---|
| 5,295,065 A | * | 3/1994 | Chapman et al. | 700/99 |
| 5,463,555 A | * | 10/1995 | Ward et al. | 700/96 |
| 5,537,325 A | * | 7/1996 | Iwakiri et al. | 700/121 |
| 5,943,484 A | * | 8/1999 | Milne et al. | 700/100 |
| 6,141,647 A | * | 10/2000 | Meijer et al. | 705/1 |
| 6,263,254 B1 | * | 7/2001 | Nishimura et al. | 700/117 |
| 6,295,478 B1 | | 9/2001 | Inada | |
| 6,345,259 B1 | * | 2/2002 | Sandoval | 705/7 |
| 6,490,495 B1 | * | 12/2002 | Murata | 700/117 |
| 2003/0109945 A1 | | 6/2003 | Cho et al. | |
| 2004/0049398 A1 | * | 3/2004 | Gartland et al. | 705/1 |

FOREIGN PATENT DOCUMENTS

| | | |
|---|---|---|
| EP | 1137013 A | 9/2001 |
| GB | 2344439 A | 6/2000 |
| JP | 09-252195 | 9/1997 |
| JP | 2004-134509 | 4/2004 |

OTHER PUBLICATIONS

Search Report

* cited by examiner

Primary Examiner—Maria N. Von Buhr

(57) ABSTRACT

The present invention is related to a component and material traceability control apparatus for controlling manufacturing lot identification information of any of a component and material constituting a product manufactured according to a process where a manufacturing apparatus with not less than one component and material reserve unit picks up a needed amount out of the component and material reserved in the component and material reserve unit and manufactures the product, and the component and material traceability control apparatus is equipped with at least a processing unit, a memory unit used as a work area by the processing unit, a manufacturing performance information memory unit, a component and material supply performance information memory unit, and a manufacturing lot trace information memory unit.

16 Claims, 9 Drawing Sheets

FIG.4

(Manufacturing Performance Information Memory Unit) ~76

| Manufacturing Apparatus Identification Number ~761 | Manufactured Article Name ~762 | Manufactured Article Identification Number ~763 | Manufacturing Start Time ~764 | Manufacturing End Time ~765 |
|---|---|---|---|---|
| M0123 | PB00A | A0001 | 0406100800 | 0406100855 |
| M0123 | PB00A | A0002 | 0406100900 | 0406100955 |
| M0123 | PB00A | A0003 | 0406101000 | 0406101055 |

FIG.5

("Component/Material" Supply Performance Information Memory Unit) ~77

| Manufacturing Apparatus Identification Number ~771 | "Component/Material" Reserve Unit Identification Number ~772 | "Component/Material" Name ~773 | Manufacturing Lot Identification Number ~774 | "Component/Material" Supply Start Time ~775 | "Component/Material" Supply Stop Time ~776 |
|---|---|---|---|---|---|
| M0123 | 123A | IC001 | LOT012A1 | 0406100820 | 0406100930 |
| M0123 | 123A | IC001 | LOT012A2 | 0406100940 | 0406101120 |
| M0123 | 123B | DI003 | LOT123B1 | 0406100830 | 0406100900 |
| M0123 | 123B | DI003 | LOT123B1 | 0406100900 | 0406101015 |
| M0123 | 123B | DI003 | LOT123B2 | 0406100900 | 0406101015 |
| M0123 | 123B | DI003 | LOT123B3 | 0406101020 | 0406101130 |
| M0123 | 123C | CA789 | LOT789C1 | 0406100810 | 0406100900 |
| M0123 | 123C | CA789 | LOT789C2 | 0406100900 | 0406100940 |
| M0123 | 123C | CA789 | LOT789C3 | 0406100940 | 0406101030 |
| M0123 | 123C | CA789 | LOT789C4 | 0406101030 | 0406101120 |

FIG.6

(Manufacturing Lot Trace Information Memory Unit) ~78

| Manufactured Article Name | Manufactured Article Identification Number | "Component/Material" Name | Manufacturing Lot Identification Number |
|---|---|---|---|
| PB00A | A0001 | IC001 | ..., LOT012A1 |
| PB00A | A0001 | DI003 | ..., LOT123B1 |
| PB00A | A0001 | CA789 | ..., LOT789C1 |
| PB00A | A0002 | IC001 | LOT012A1, LOT012A2 |
| PB00A | A0002 | DI003 | LOT123B1, LOT123B2 |
| PB00A | A0002 | CA789 | LOT789C2, LOT789C3 |
| PB00A | A0003 | ... | ... |

(Manufactured Article Configuration Information Memory Unit) ~80

| Manufactured Article Name /801 | "Component/Material" Name /802 |
|---|---|
| PB00A | IC001 |
| PB00A | DI003 |
| PB00A | CA789 |
| ... | ... |

(Purchase Lot Trace Information Memory Unit) ~79

| Purchase Lot Identification Number | "Component/Material" Name | Manufacturing Lot Identification Number |
|---|---|---|
| PO1001 | IC001 | LOT012A1 |
| PO1002 | IC001 | LOT012A2 |
| PO1011 | DI003 | LOT123B1 |
| PO1012 | DI003 | LOT123B1, LOT123B2 |
| PO1013 | DI003 | LOT123B2 |
| PO1021 | CA789 | LOT789C1 |
| PO1022 | CA789 | LOT789C2 |
| PO1023 | CA789 | LOT789C3 |
| PO1024 | CA789 | LOT789C4 |

791 = Purchase Lot Identification Number; 792 = "Component/Material" Name; 793 = Manufacturing Lot Identification Number

COMPONENT AND MATERIAL TRACEABILITY CONTROL APPARATUS, CONTROL METHOD, CONTROL PROGRAM, AND CONTROL PROGRAM MEMORY MEDIUM

CROSS-REFERENCE TO A RELATED APPLICATION

This application claims the benefit of the filing date of Japanese Patent Application No. 2004-217240 filed on Jul. 26, 2004, which is hereby incorporated by reference.

BACKGROUND OF THE INVENTION

1. Field of the Invention

The present invention relates to a component and material traceability control apparatus, control method, control program, and control program memory medium for controlling manufacturing lot identification information of a component and material constituting a product.

2. Description of the Related Art

When there is a defect in a produced and sold product, an enterprise that has manufactured or sold the product receives not a little damage on a management thereof. Therefore, an enterprise of a manufacturing industry performs quality control in all processes from a product design to a manufacturing till a packaging. However, even how the quality control is reinforced, a possibility of an inferior quality product flowing into a market cannot be completely made zero. If the possibility of the inferior quality product flowing into the market is not completely zero, it becomes a big problem how to swiftly inquire into a cause thereof and how to recover the inferior quality product from the market without cost.

Generally, when an inferior quality problem occurs in a product, a measure of a product recovery and change is taken for a product already delivered to a market; and a measure such as a delivery stop, manufacturing stop, and the like is taken for a product before a delivery. In addition, with respect to a product made as an inferior quality product, a manufacturing date of the product, an apparatus used in a manufacturing thereof, an origin of a component and material constituting the product, and the like are traced back, and thereby a cause of the inferior quality is inferred or specified. And when the cause of the inferior quality is specified, a treatment for removing the cause is performed. In addition, when there is a defect in some of a component of a product, upon recovering the component based on a manufacturing number and manufacturing lot number thereof for the product having flowed into the market, some defective component is changed. In addition, at a manufacturing job site the manufacturing is reopened, upon changing the component used.

Thus in order to inquire into a cause of the inferior quality and to recover an inferior quality product from a market, the manufacturing number or the manufacturing lot number plays an important role.

In this connection, many industrial products are manufactured by working or assembling many components and materials (hereinafter referred to as "component/material (part)"). And in many cases the "component/material" is manufactured in other enterprises and is purchased. Accordingly, in the inferior quality of a product there are something originated in a design or a manufacturing process and something brought from outside as the inferior quality of a purchase "component/material." Therefore, when intending to swiftly inquire into the cause and to recover the product at low cost, it is necessary to control each manufacturing number and each manufacturing lot number of the "component/material" used for each product manufactured.

Conventionally, it is already known a system of controlling each manufacturing number and manufacturing lot number of the "component/material" used for each product. For example, at paragraphs 0006 to 0026 and FIGS. 1 to 3 of Japanese Patent Laid-Open Publication No. 2004-134509 (hereinafter referred to as patent document 1), at a portion where a conventional technology is described is shown an example of a traceability system for controlling the manufacturing lot number of the "component/material" used for an electronic circuit board with respect to the board manufactured. And as a technology of the patent document 1, instead of controlling the manufacturing lot number, is shown an example of the traceability system, where a manufactured electronic circuit board is designed to control a process by its passing time and to simultaneously control the manufacturing lot number of the "component/material" in each process.

In addition, at paraphrases 0006 to 0026 and FIGS. 1 to 7 of Japanese Patent Laid-Open Publication Hei. 9-252195 (hereinafter referred to as patent document 2) is shown, in an apparatus for mounting the "component/material" on an electronic circuit board, a control system of a resupply "component/material" where a history of an identification number of the "component/material" actually mounted is designed to be kept in order to enable a trace of the "component/material" mounted, when there occurs a trouble in the electronic circuit board manufactured, and to prevent an erroneous mount.

In the patent documents 1 and 2 one manufacturing number or manufacturing lot number is made to correspond to each "component/material" used in a product. Thus the "component/material" can be accurately made to correspond to the manufacturing number or manufacturing lot number. However, if attempting to accurately make the "component/material" correspond to the manufacturing number or manufacturing lot number, a manufacturing apparatus and control procedure for make the correspondence become complicated. As a result, the manufacturing cost and control cost of the product result in becoming large.

For example, with respect to a pass capacitor and the like used in an electronic circuit board, because the "component/material" itself is small, there is no space for affixing a barcode and the like for indicating a manufacturing lot number thereof. If so, the control of the manufacturing lot number can be performed in nothing but a level of a storage case for packaging the "component/material." In that case "component/material" with a plurality of manufacturing lot numbers cannot be put in one storage case. Or, even if the "component/material" with the plurality of the manufacturing lot numbers can be put in one storage case, it results in standing extra control cost for such as being stored in specific order and making a table of the manufacturing lot numbers matching storage positions.

Consequently, for example, there is some idea of not controlling a manufacturing lot number for "component/material" such as a pass capacitor similar to "a screw and a nail." However, in that case, when there occurs an inferior quality problem in the "component/material" not controlled, a clue for inquiring into a cause thereof is lost. In addition, for example, even when the manufacturing lot number and the like of the "component/material" with the inferior quality become clear, product recovery cost results in becoming larger because the manufacturing number of the product using the "component/material" of the inferior quality cannot be narrowed down.

Thus considering the problems of conventional technologies, it is strongly requested a traceability control apparatus, control method, control program, and control program memory medium that simplify the manufacturing lot number control of the "component/material" constituting a product, and thereby that can reduce control cost thereof.

SUMMARY OF THE INVENTION

In order to solve the above problems, a "component/material (part)" traceability control apparatus of the present invention is an apparatus for controlling manufacturing lot identification information of "component/material," which constitutes a product, in the product manufactured according to a process where a manufacturing apparatus comprising not less than one "component/material" reserve unit takes out a needed amount out of the "component/material" reserved in the "component/material" reserve unit and thereby manufactures the product; wherein the "component/material" traceability control apparatus is designed to be a configuration of comprising at least a processing unit, a memory unit used as a working area by the processing unit, a manufacturing performance information memory unit, a "component/material" supply performance information memory unit, and a manufacturing lot trace information memory unit. And with respect to the product manufactured by the manufacturing apparatus, information of manufacturing start time and end time by the manufacturing apparatus is made to correspond to manufacturing apparatus identification information of the manufacturing apparatus and manufactured article (assemble module) identification information of the product manufactured, and thus is memorized in the manufacturing performance information memory unit; and in addition, "component/material" supply start time and stop time when a supply of predetermined "component/material" is started and stopped in a "component/material" reserve unit of the manufacturing apparatus are made to correspond to the manufacturing lot identification information of the "component/material," the manufacturing apparatus identification information of the manufacturing apparatus, the "component/material" reserve unit identification information of the "component/material" reserve unit, and a name of the "component/material" supplied and thus are memorized in the "component/material" supply performance information memory unit. And a product manufactured by the manufacturing apparatus is designed so that not less than one piece of manufacturing lot identification information of "component/material" usable in the product is extracted, and not less than the one piece of manufacturing lot identification information extracted is made to correspond to the manufactured article identification information and the name of the "component/material" and is memorized in the manufacturing lot trace information memory unit, based on the information of the manufacturing start time and end time of a product memorized in the manufacturing performance information memory unit and the information of the "component/material" supply start time and stop time memorized in the "component/material" supply performance information memory unit.

Thus the "component/material" traceability control apparatus of the present invention obtains the information of a basis of manufacturing lot trace information, matching timings of major events in any of a manufacturing apparatus and a manufacturing process, that is, a manufacturing start and end of a product, and "component/material" supply start and stop of "component/material" in a "component/material" reserve unit. And at that time the control apparatus does not make manufacturing lot identification information correspond to each "component/material." As a result, although a plurality of manufacturing lot identification information are made to correspond to one "component/material" in some case, the cost of the manufacturing apparatus and the control cost for obtaining traceability control information can be reduced.

In addition, when in the present invention, in a "component/material" reserve unit of a manufacturing apparatus, the manufacturing lot trace information memory unit makes "component/material" supply start time of a supply of a predetermined "component/material" being started and "component/material" supply stop time of the supply being stopped correspond to the manufacturing lot identification information of the "component/material," the manufacturing apparatus identification information of the manufacturing apparatus, the "component/material" reserve unit identification information of the "component/material" reserve unit, and the name of the "component/material" supplied and thus memorizes the start time and stop time in the "component/material" supply performance information memory unit, the manufacturing lot identification information is designed to be not less than one piece of manufacturing lot identification information.

In other words, a plurality of manufacturing lot identification information is designed to be able to correspond to one "component/material" supplied to a "component/material" reserve unit. Therefore, it becomes enabled to mix "component/material" with a plurality of manufacturing lot numbers into a package case and a storage case. Or it also becomes enabled to mix a "component/material" with a plurality of manufacturing lot numbers in a "component/material" reserve unit of a manufacturing apparatus. Therefore, the control of the manufacturing lot identification information of the "component/material" is simplified and the cost of the manufacturing apparatus is reduced.

BRIEF DESCRIPTION OF THE DRAWINGS

FIG. 4 is a drawing showing a configuration example of records memorized in a manufacturing performance information memory unit in an embodiment of the present invention.

FIG. 5 is a drawing showing a configuration example of records memorized in a "component/material" supply performance information memory unit in an embodiment of the present invention.

FIG. 6 is a drawing showing a configuration example of records memorized in a manufacturing lot trace information memory unit in an embodiment of the present invention.

FIG. 7 is a drawing showing a configuration example of records memorized in a manufactured article configuration information memory unit in an embodiment of the present invention.

DESCRIPTION OF THE PREFERRED EMBODIMENTS

Here will be described embodiments of the present invention in detail, referring to drawings as needed.

Figure 1:
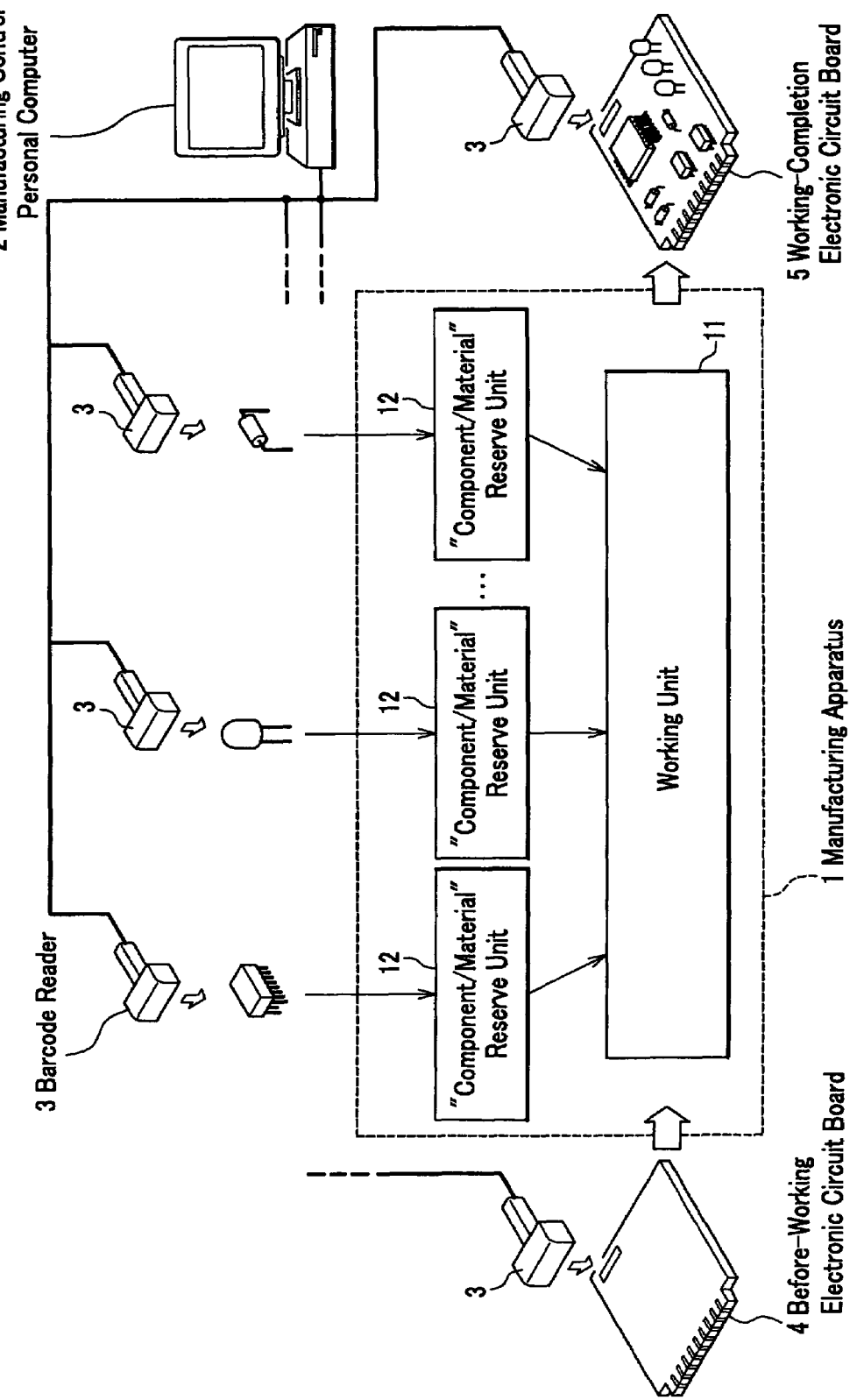
FIG. 1 is a drawing exemplifying a manufacturing model of an electronic circuit board using a manufacturing apparatus where the present invention is applied.

FIG. 1 is a drawing exemplifying a manufacturing model of an electronic circuit board using a manufacturing apparatus where the present invention is applied. In FIG. 1 a manufacturing apparatus 1 is an electronic circuit board manufacturing apparatus and comprises a working unit 11 and a plurality of "component/material (part)" reserve units 12; and in addition, a manufacturing control personal computer 2 is connected to the manufacturing apparatus 1.

The manufacturing apparatus 1 of this case is an apparatus for mounting an electronic circuit component on a before-working electronic circuit board 4 where a through hole is already formed and which is print-wired, for performing soldering by a reflow solder and a flow solder, and for manufacturing a working-completion electronic circuit board 5. Although in FIG. 1 the working unit 11 is shown only one, it actually comprises a plurality of working units consisting of a chip mounting apparatus, a soldering tool, and the like. Here to make a description easily understandable, the working unit 11 is assumed to comprise one chip mounting apparatus.

The "component/material" reserve unit 12 is a container for temporary keeping an electronic circuit component mounted on the before-working electronic circuit board 4. As electronic circuit components, there are LSI (Large Scale Integrated Circuits), IC (Integrated Circuits), diodes, resistances, capacitors, and the like. These electronic circuit components are usually delivered from an electronic component manufacturer in a form contained in a carrier tape and a feeder cart (called a magazine in some case). Therefore, many actual "component/material" reserve units 12 are designed so that these carrier tape and feeder cart can be directly set. Accordingly, manufacturing lot numbers of electronic circuit components are usually added to the carrier tape and the feeder cart, and in the embodiment it is assumed that a barcode of a manufacturing lot number is added to a "component/material" containing case such as the carrier tape and the feeder cart. Here, the barcode may also be a two-dimensional one.

The chip mounting apparatus of the working unit 11 takes out electronic circuit components one by one contained in the "component/material" reserve unit 12 and mounts them on predetermined positions of the before-working electronic circuit board 4. Meanwhile, there are also a plurality of types in the chip mounting apparatus, and when manufacturing a usual electronic circuit board, two kinds of chip mounting apparatuses are used in many cases. Here, even when chip mounting apparatuses used are plural, this is regarded as one chip mounting apparatus, totally including this.

In FIG. 1 the manufacturing control personal computer 2 is connected to the working unit 11 and each of the "component/material" reserve units 12 through lines not shown and monitors each operation situation thereof. In addition, the personal computer 2 comprises barcode readers 3 and, through them, reads a barcode of a manufactured article (assemble module) identification number printed on the before-working electronic circuit board 4 and the working-completion electronic circuit board 5. In addition, through the barcode readers 3, the personal computer 2 reads a barcode of a manufacturing lot identification number added to a carrier tape and a feeder cart set at the "component/material" reserve unit 12.

Meanwhile, here instead of the barcode readers 3, a monitor camera and a character recognition apparatus may be used. In this case a manufactured article identification number and the like according to a character may be printed on an electronic circuit board and the like instead of a barcode. In addition, an IC tag reader may be used instead of the barcode readers 3. In this case an IC tag is assumed to be affixed to a containing case of an electronic circuit board and an electronic circuit component.

Figure 2:
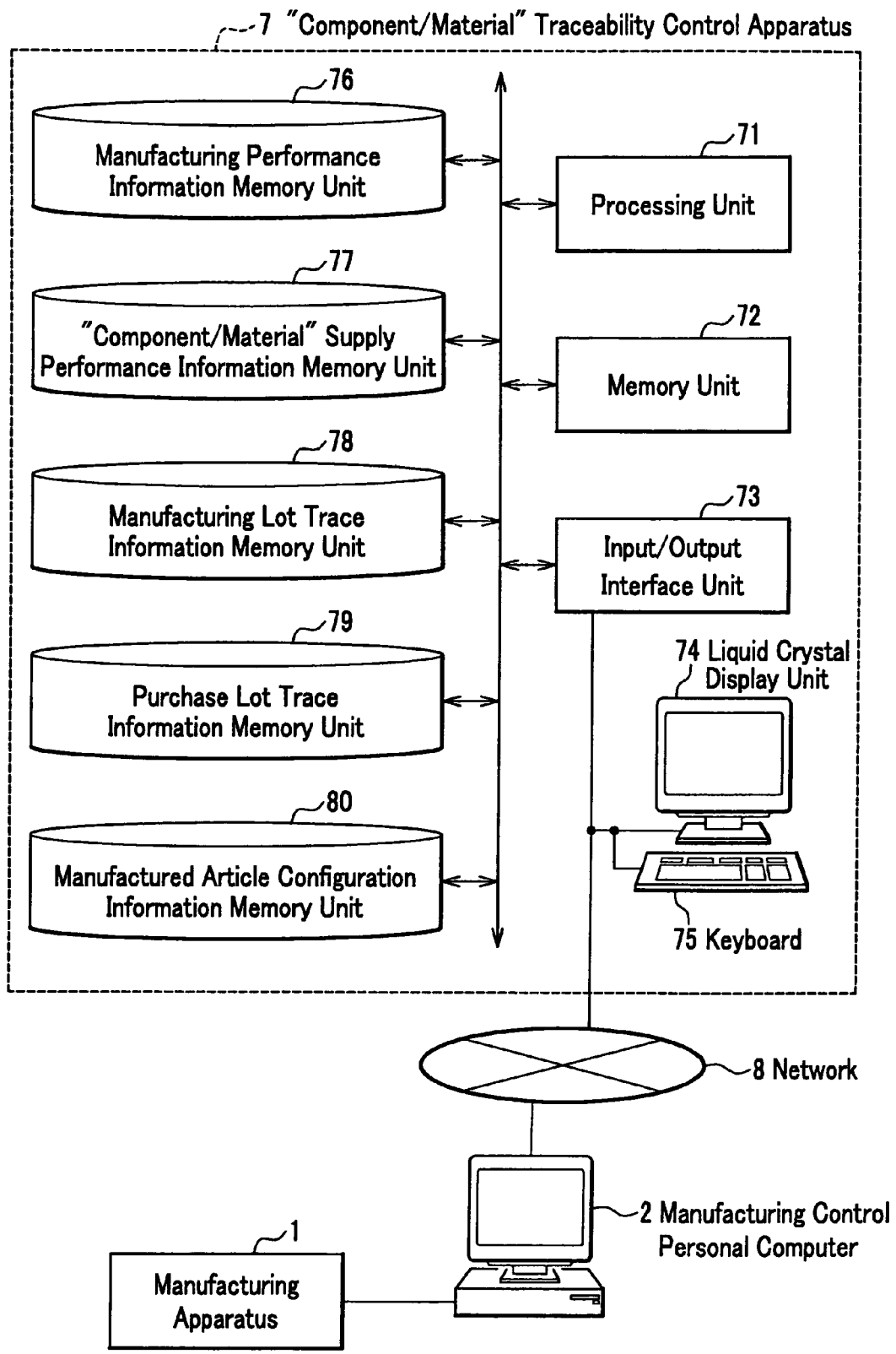
FIG. 2 is a drawing showing a configuration example of a "component/material (part)" traceability control apparatus in an embodiment of the present invention.

FIG. 2 is a drawing showing a configuration example of a "component/material" traceability control apparatus in the embodiment. In FIG. 2 a "component/material" traceability control apparatus 7 is a computer comprising a processing unit 71, a memory unit 72, an input/output interface unit 73, a liquid crystal display unit 74, a keyboard 75, a manufacturing performance information memory unit 76, a "component/material" supply performance information memory unit 77, a manufacturing lot trace information memory unit 78, a purchase lot trace information memory unit 79, and a manufactured article configuration information memory unit 80.

Here, the memory unit 72 comprises a semiconductor memory and a magnetic hard disk device, and a program and operating system for realizing a function of the "component/material" traceability control apparatus 7 are stored therein. And the memory unit 72 is also used as a working area when the processing unit 71 runs the program.

Here, the input/output interface unit 73 comprises interfaces for connecting outside peripherals such as an interface with the liquid crystal display unit 74 and the keyboard 75 and an interface with a network 8. In addition, the liquid crystal display unit 74 and the keyboard 75 are used for a user's inputting information in the "component/material" traceability control apparatus 7 and consulting information. Here, instead of the liquid crystal display unit 74, another display unit such as a CRT (Cathode Ray Tube) and the like may be used.

The performance information memory unit 76, "component/material" supply performance information memory unit 77, manufacturing lot trace information memory unit 78, purchase lot trace information memory unit 79, and manufactured article configuration information memory unit 80 are configured on a large capacity memory device such as a magnetic hard disk device and memorize information for realizing the function of the "component/material" traceability control apparatus 7. With respect to a content of information which each of the memory units 76 to 80 memorizes, it will be separately described in detail, using drawings.

In FIG. 2 the "component/material" traceability control apparatus 7 is connected to the network 8 such as a LAN (Local Area Network) through the input/output interface unit 73, and further connected to the manufacturing control personal computer 2 of the manufacturing apparatus 1 through the network 8. Although in FIG. 2 only one personal computer 2 is depicted, a configuration of a plurality of manufacturing control personal computers 2 being connected is also available. In addition, the manufacturing control personal computers 2 may control manufacturing information of a plurality of manufacturing apparatuses 1.

Figure 3:
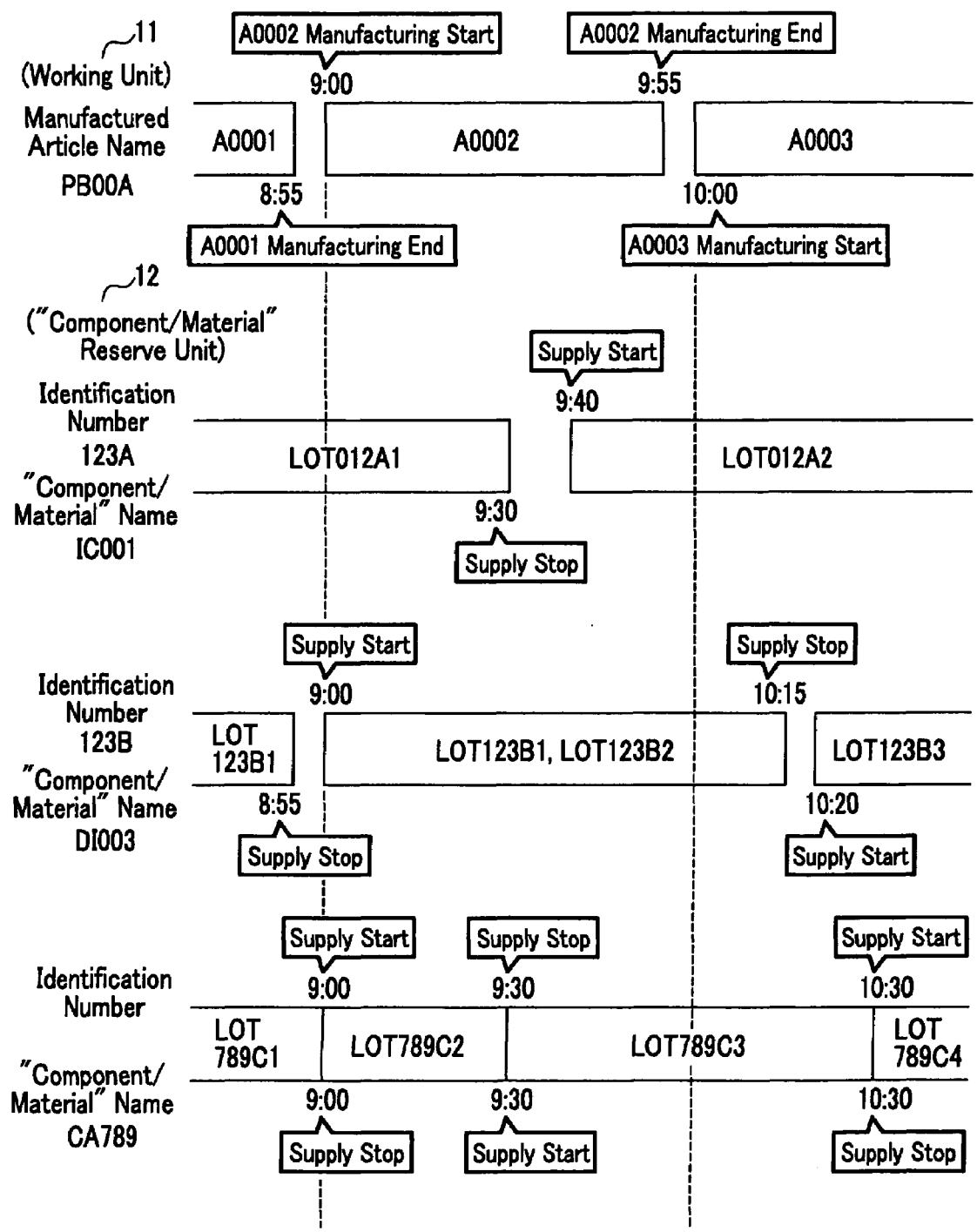
FIG. 3 is a drawing exemplifying a time chart of a manufacturing procedure of a manufactured article (assembled module) and that of a "component/material" supply procedure to a "component/material" reserve unit by a manufacturing apparatus in an embodiment of the present invention.

FIG. 3 is a drawing exemplifying a time chart of a manufacturing procedure of a manufactured article and that of a "component/material" supply procedure to a "component/material" reserve unit by a manufacturing apparatus in the embodiment. Here will be described the manufacturing procedure in the electronic circuit board manufacturing apparatus shown in FIG. 1, using FIG. 3.

In FIG. 3 a time chart at an utmost stage is the chart showing a manufacturing procedure of an electronic circuit board with a manufactured article name PB00A. In accordance with the time chart, a manufacturing of an electronic circuit board with a manufactured article identification number A0001 is finished at eight fifty five in the working unit 11 of the manufacturing apparatus 1 and is removed from the working unit 11. Next, another electronic circuit board with a manufactured article identification number A0002 is set in the working unit 11, and a manufacturing thereof is started at nine o'clock. And the manufacturing of the electronic circuit board with the manufactured article identification number A0002 is finished at nine fifty five and is removed from the working unit 11. Next, still another electronic circuit board with a manufactured article identification number A0003 is set in the working unit 11, and a manufacturing thereof is started at ten o'clock.

A manufactured article identification number (for example, A0001) is printed with a barcode at a predetermined position of a surface of the before-working electronic circuit board 4. Consequently, when the before-working electronic circuit board 4 is set in the working unit 11, the manufacturing control personal computer 2 reads the barcode through one of the barcode readers 3 and memorizes time then as manufacturing start time. In addition, when the manufacturing of the electronic circuit board is finished and the working-completion electronic circuit board 5 thereof is removed from the working unit 11, the manufacturing control personal computer 2 again reads the barcode through the barcode reader 3 and memorizes time then as manufacturing end time.

In FIG. 3 time charts below a third stage are the charts showing a procedure for supplying "component/material" with respective "component/material" names IC001, DI003, and CA789 to the "component/material" reserve units 12 with respective identification numbers 123A, 123B, and 123C.

In accordance with FIG. 3, in the "component/material" reserve unit 12 with the identification number 123A is at first reserved "component/material" (for example, an IC chip) with the "component/material" name IC001 and a manufacturing lot identification number LOT012A1 in a state of being contained in any of a carrier tape and a feeder cart; and the "component/material" is completely used at nine thirty, and a supply thereof is stopped from the "component/material" reserve unit 12. And "component/material" with the "component/material" name IC001 and a manufacturing lot identification number LOT012A2 is newly set in the "component/material" reserve unit 12 with the identification number 123A in a state of being contained in any of a carrier tape and a feeder cart; and a supply thereof is started at nine forty.

Similarly, in the "component/material" reserve unit 12 with the identification number 123B is at first reserved "component/material" (for example, a diode chip) with the "component/material" name DI003 and a manufacturing lot identification number LOT123B1, and a supply thereof is stopped at eight fifty five. And "component/material" with the "component/material" name DT003 and the manufacturing lot identification number LOT123B1 or LOT123B2 is set at the "component/material" reserve unit 12 with the identification number 123B in a state of being contained in any of a carrier tape and a feeder cart, a supply thereof is started at nine o'clock, and the supply is stopped at ten fifteen. Furthermore similarly, the supply of "component/material" with the "component/material" name DI003 and a manufacturing lot identification number LOT123B3 is started at ten twenty.

In addition, in the "component/material" reserve unit 12 with the identification number 123C is started and stopped the supply of "component/material" (for example, a capacitor) with the "component/material" name CA789 according to the similar procedure. However, the example of this time chart is different from other ones in a point that time from the supply stop to supply start of the "component/material" is zero.

In the embodiment a manufacturing lot identification number of relevant "component/material" is added to any of a carrier tape and feeder cart of a "component/material" containing case with a barcode. Consequently, when the "component/material" containing case is set in the "component/material" reserve unit 12, the manufacturing control personal computer 2 reads the barcode added to the "component/material" containing case through the barcode reader 3 and memorizes time then as "component/material" supply start time. In addition, if the manufacturing control personal computer 2 detects that the "component/material" in the "component/material" reserve unit 12 runs short, it memorizes time then as "component/material" supply stop time and request for an operator or an automatic loader not shown to remove an empty "component/material" containing case and to set a new one.

In addition, FIG. 3 shows that "component/material" with different manufacturing lot identification numbers (LOT123B1 and LOT123B2) is mixed in the "component/material" reserve unit 12 with the identification number 123B from nine o'clock to ten fifteen.

In such the case the manufacturing control personal computer 2 of the present invention does not discriminate the "component/material" with the manufacturing lot identification number LOT123B1 from one with the manufacturing lot identification number LOT123B2 that are mixed in the "component/material" reserve unit 12. Because this makes the configuration of the manufacturing apparatus 1 simpler, the cost of the manufacturing apparatus 1 results in being lower. Here, because if it is designed that a manufacturing lot identification number can be discriminated, various burdens and restrictions are added to a supply mechanism and supply procedure of "component/material" in the "component/material" reserve unit 12, an apparatus configuration thereof becomes complicated, and apparatus cost thereof becomes larger.

Consequently, in such the case the embodiment makes a plurality of manufacturing lot identification numbers correspond to one "component/material." In other words, the manufacturing control personal computer 2 assumes that a manufacturing lot identification number of the "component/material" with the "component/material" name DI003 used in an electronic circuit board with the manufactured article identification number A0002 is any of LOT123B1 and LOT123B2, and the personal computer 2 memorizes both manufacturing lot identification numbers.

Thus there occurs a situation that "component/material" with different manufacturing lot identification numbers is mixed in one "component/material" reserve unit 12 in following cases:

- a case that "component/material" with a plurality of manufacturing lot identification numbers is mixed and contained in a carrier tape, a feeder cart, and another "component/material" containing case;"
- a case of not a configuration that a plurality of carrier tapes and feeder carts can be set in the "component/material" reserve unit 12 and that the working unit 11 can discriminate the carrier tapes and feeder carts, even if "component/material" with a same manufacturing lot identification number is contained in the carrier tapes and the feeder carts; and
- a case of replenishing another "component/material" with a different manufacturing lot identification number notwithstanding "component/material" remaining in the "component/material" reserve unit 12.

Meanwhile, the case (3) is such a case that "component/material" is replenished at a manufacturing start timing in the working unit 11, and such the case may be thought to actually often happen.

Furthermore, on the way of the working unit 11 manufacturing the electronic circuit board with the manufactured article identification number A0002, in the "component/material" reserve unit 12 with the identification number 123A, the manufacturing lot identification number of the "component/material" with the "component/material" name IC001 is changed from LOT012A1 to LOT012A 2. In such the case there is a possibility that not only the "component/material" with the manufacturing lot identification number LOT012A1 but also the "component/material" with the manufacturing lot identification number LOT012A2 are used in the electronic circuit board with the manufactured article identification number A0002. In such the case the embodiment does not discriminate the manufacturing lot identification numbers of the "component/material," and the manufacturing control personal computer 2 memorizes both of two manufacturing lot identification numbers LOT012A1 and LOT012A 2 as the manufacturing lot identification number of the "component/material" with the "component/material" name IC001 used in the electronic circuit board with the manufactured article identification number A0002.

Thus as described in FIG. 3, when a manufactured article manufactured by the manufacturing apparatus 1 is put in and taken out from the working unit 11, the manufacturing control personal computer 2 reads a manufactured article identification number added to the manufactured article and memorizes the manufacturing lot identification number read, together with time then (manufacturing start time and end time). In addition, when "component/material" is supplied to the "component/material" reserve unit 12, and it becomes empty or it becomes necessary to replenish new "component/material," the manufacturing control personal computer 2 reads a manufacturing lot identification number of "component/material" added to any of the "component/material" and a containing case thereof and memorizes the manufacturing lot identification number read, together with time then ("component/material" supply start time and stop time).

Furthermore, the manufacturing control personal computer 2 sends information, where the manufacturing apparatus identification number of the manufacturing apparatus 1 and a manufactured article name manufactured are added to a manufactured article identification number memorized, manufacturing start time, and manufacturing end time that are memorized, to the "component/material" traceability control apparatus 7 through the network 8. In addition, similarly, the manufacturing control personal computer 2 sends information, where the manufacturing apparatus identification number of the manufacturing apparatus 1, the "component/material" reserve unit identification number of the "component/material" reserve unit 12, and the "component/material" name are added to the "component/material" manufacturing lot identification number, "component/material" supply start time, and "component/material" supply stop time that are memorized, to the "component/material" traceability control apparatus 7 through the network 8.

FIG. 4 is a drawing showing a configuration example of records memorized in the manufacturing performance information memory unit 76 in the embodiment. Here, a record means a plurality of information collected up to one set as interrelated information, and when memorized in a memory device such a magnetic hard disk, it is handled as one set of information to be memorized. In addition, one record is constituted of a plurality of fields, and in one field is usually memorized one piece of information.

In FIG. 4 a record of the manufacturing performance information memory unit 76 is constituted of fields comprising a manufacturing apparatus identification number 761, a manufactured article name 762, a manufactured article identification number 763, a manufacturing start time 764, and a manufacturing end time 765, respectively.

The "component/material" traceability control apparatus 7 receives the information of a manufactured article identification number, manufacturing start time, manufacturing end time, manufacturing apparatus identification number, and manufactured article name relating to a product manufactured by the manufacturing apparatus 1 out of information sent from the manufacturing control personal computer 2 and memorizes the information as one record in the manufacturing performance information memory unit 76. In other words, in the field of the manufacturing apparatus identification number 761 is memorized the manufacturing apparatus identification number of the manufacturing apparatus 1, in the field of the manufactured article name 762 is memorized the name of the manufactured article manufactured by the manufacturing apparatus 1, and in the field of the manufactured article identification number 763 is memorized the manufactured article identification number of the manufactured article manufactured by the manufacturing apparatus 1. In addition, in the fields of the manufacturing start time 764 and the manufacturing end time 765 are respectively memorized the manufacturing start time and manufacturing end time of the manufactured article with a manufactured article identification number specified by the field of the manufactured article identification number 763.

For example, a second record of manufacturing information of FIG. 4 indicates that a manufacturing of an electronic circuit board with the manufactured article name PB00A and the manufactured article identification number A0002 is started at nine o'clock on the tenth of June, 2004 and finished at nine fifty five on the same day by the manufacturing apparatus 1 with a manufacturing apparatus identification number M0123.

FIG. 5 is a drawing showing a configuration example of records memorized in the "component/material" supply performance information memory unit 77 in the embodiment. In FIG. 5 a record of the "component/material" supply performance information memory unit 77 is constituted of fields comprising a manufacturing apparatus identification number 771, a "component/material" reserve unit identification number 772, a "component/material" name 773, a manufacturing lot identification number 774, a "component/material" supply start time 775, and a "component/material" supply stop time 776, respectively.

The "component/material" traceability control apparatus 7 receives the information of a manufacturing lot identification number, "component/material" supply start time, "component/material" supply stop time, manufacturing apparatus identification number, "component/material" reserve unit identification number, and "component/material" name relating to "component/material" supplied to the "component/material" reserve unit 12 out of information sent from the manufacturing control personal computer 2 and memorizes the information as one record in the "component/material" supply performance information memory unit 77. In other words, in the field of the manufacturing apparatus identification number 771 is memorized the manufacturing apparatus identification number of the manufacturing apparatus 1, in the field of the "component/material" reserve unit identification number 772 is memorized the identification number of the "component/material" reserve unit 12 where the "component/material" is supplied, and in the field of the "component/material" name 773 is memorized the name of the "component/material." In addition, in the field of the manufacturing lot identification number 774 is memorized the manufacturing lot identification number of the "component/material" actually supplied to the "component/material" reserve unit 12, and in the fields of the "component/material" supply start time 775 and the "component/material" supply stop time 776 are respectively memorized time, when any of the "component/material" and a containing case thereof is set, and time, when the "component/material" runs short or the containing case is removed.

For example, a second record of the "component/material" supply performance information of FIG. 5 indicates that "component/material" with the "component/material" name IC001 and the manufacturing lot identification number LOT012A2 is started to be supplied at nine forty on the tenth of June, 2004 and stopped to be supplied at eleven twenty on the same day in the "component/material" reserve unit 12 of the manufacturing apparatus 1 with the "component/material" reserve unit identification number 123A and the manufacturing apparatus identification number M0123, respectively. In addition, forth and fifth records of the "component/material" supply performance information of FIG. 5 indicate that "component/material" with the same "component/material" name (DI003) and two different manufacturing lot identification numbers (LOT123B1 and LOT123B2) is supplied at the same time zone (from nine o'clock till ten fifteen on the tenth of June, 2004).

Thus if the "component/material" traceability control apparatus 7 memorizes information sent from the manufacturing control personal computer 2 in the manufacturing performance information memory unit 76 and the "component/material" supply performance information memory unit 77, it obtains manufacturing lot trace information, based on the information memorized, and memorizes a result thereof in the manufacturing lot trace information memory unit 78.

Figure 8:
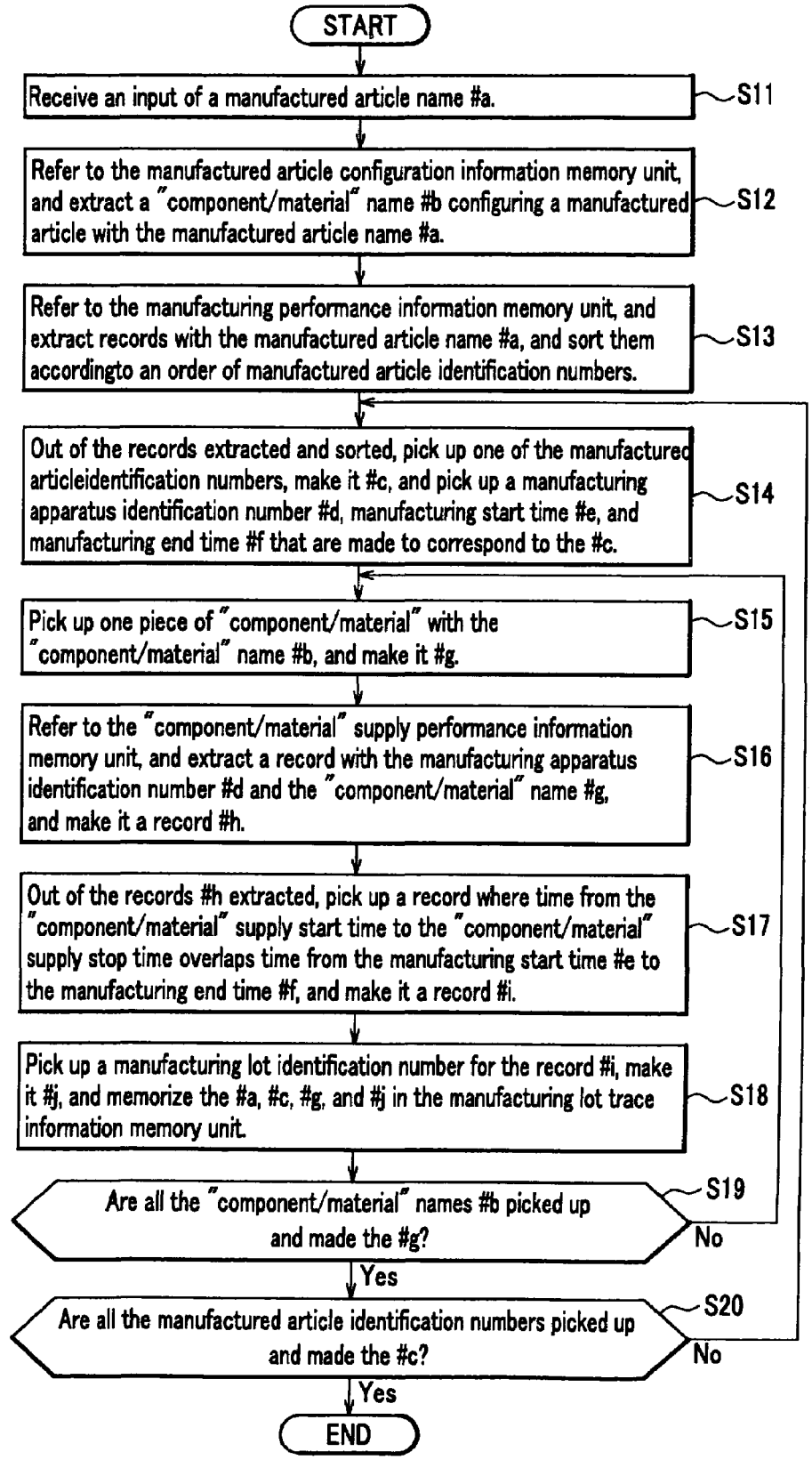
FIG. 8 is an example of a flowchart showing a procedure for obtaining traceability information of "component/material" memorized in a manufacturing lot trace information memory unit in an embodiment of the present invention.

FIG. 6 is a drawing showing a configuration example of records memorized in the manufacturing lot trace information memory unit 78 in the embodiment; FIG. 7 is a drawing showing a configuration example of records memorized in a manufactured article configuration information memory unit 80 in the embodiment; and FIG. 8 is an example of a flowchart showing a procedure for obtaining traceability information of a "component/material" memorized in the manufacturing lot trace information memory unit 78 in the embodiment.

In FIG. 6 a record of the manufacturing lot trace information memory unit 78 is constituted of fields comprising a manufactured article name 781, a manufactured article identification number 782, a "component/material" name 783, and a manufacturing lot identification number 784. And the record means, for example, that in a case of a fourth record "a manufacturing lot identification number of "component/material" with the name IC001 constituting a manufactured article (electronic circuit board) with the manufactured article name PB00A and the manufactured article identification number A0002 is any of LOT012A and LOT012A2." Accordingly, if there is the information of the manufacturing lot trace information memory unit 78, manufacturing lot identification information of "component/material" used in a manufactured article can immediately be known according to a manufactured article identification number thereof; on the contrary, a manufactured article name and manufactured article identification number where the "component/material" is used can be known according to a "component/material" name and a manufacturing lot identification number thereof. In other words, the information of the manufacturing lot trace information memory unit 78 can be said to be traceability information of "component/material" constituting a manufactured article.

Meanwhile, in the field of the manufacturing lot identification number 784, a memorable area of a plurality of manufacturing lot identification numbers is assumed to be ensured, and the plurality of manufacturing lot identification numbers are memorized as needed. That in the field of the manufacturing lot identification number 784 a plurality of manufacturing lot identification numbers is memorized means that in some case a resolution of the traceability information is lowered. However, when constituting a product with specifically using small "component/material" such as "a screw and a nail," an effect of reducing cost for obtaining the traceability information is larger.

In FIG. 7 the manufactured article configuration information memory unit 80 is constituted of fields comprising a manufactured article name 801 and a "component/material" name 802, respectively. Manufactured article configuration information memorized in the manufactured article configuration information memory unit 80 is a so called component table and a list of "component/material" constituting a manufactured article specified by a manufactured article name. Although the component table is often expressed in a hierarchical structure description, the manufactured article configuration information is here assumed to be a flat (one hierarchical) structure. Meanwhile, because information of the component table memorized in the manufactured article configuration information memory unit 80 is made in designing, it is here assumed to simplify a description that the information made is used as it is (in some case the hierarchical structure is converted to the flat structure).

Next, according to the flowchart of FIG. 8, information to be memorized in the manufactured article trace information memory unit 78 of FIG. 6 is obtained, based on information memorized in the manufactured article configuration information memory unit 80 of FIG. 7, the manufacturing performance information memory unit 76 of FIG. 4, and the "component/material" supply performance information memory unit 77 of FIG. 5. Meanwhile, a procedure shown therein is a run procedure of a computer program, and usually such the program is stored in the memory unit 72 (see FIG. 2), and the processing unit 71 reads the program from the memory unit 72 as needed and runs it. In addition, the program is memorized in a computable-readable memory medium such as a CD-ROM (Compact Disk Read Only Memory) and is read as needed into the memory unit 72 through a CD-ROM drive dive and the like not shown in FIG. 2.

In FIG. 8, firstly receive an input of a manufactured article name, and make the manufactured article name # a (step S11). Meanwhile, an operator may perform the input through the key board 75 or another program may input the data #a as a parameter. And refer to the manufactured article configuration information memory unit 80, and extract a "component/material" name #b configuring a manufactured article with the manufactured article name #a (step S12). Here, as the "component/material" name #b, a plurality of "component/material" names are extracted. Next, refer to the manufacturing performance information memory unit 76, and extract records with the manufactured article name # a, and sort them according to an order of manufactured article identification numbers (step S13).

Next, out of the records extracted and sorted in the step S13, pick up one of the manufactured article identification numbers, make it #c, and pick up a manufacturing apparatus identification number, manufacturing start time, and manufacturing end time that are made to correspond to the #c by a record comprising it, and make them #d, #e, and #f, respectively (step S14). Next, pick up one piece of "component/material" with the "component/material" name #b, and make it #g (step S15).

Refer to the "component/material" supply performance information memory unit 77, and extract a record with the manufacturing apparatus identification number #d and the "component/material" name #g, and make it a record #h (step S16). Here, as the record #h are usually extracted a plurality of records. Consequently, out of the records #h extracted in the step S16, pick up a record where time from supply start time to supply stop time of the "component/material" overlaps time from manufacturing start time to manufacturing end time specified by the #e and the #f, and make it a record #i (step S17). Here, as the record #i are extracted a plurality of records in some case. Next, pick up a manufacturing lot identification number for the record #i, make it #j, and memorize the #a, #c, #g, and #j in the manufacturing lot trace information memory unit 78 (step S18). Meanwhile, although when the record #i is plural records, the #j also becomes plural, in this case the manufacturing lot trace information memory unit 78 memorizes a plurality of the #i for the #a, #c, and #g.

Next, determine whether or not the "component/material" names extracted as the "component/material" names #b in the step S12 is all picked up and made the #g in the step S15 (step S19). In a determination thereof, if all the "component/material" names are not picked up and not made the #g (No in the step S19), return to the step S15, and again run the procedure from the step S15. On the other hand, in a determination of the step S19, if all the "component/material" names are picked up and made the #g (Yes in the step S19), determine whether or not all the manufactured article identification numbers are picked up out of the records extracted and sorted in the step S13 and are made the #c (step S20). And in a determination thereof, if there is still a manufactured article identification number not made the #c (No in the step S20), return to the step S14, and again run the procedure from the step S14. On the other hand, if in a determination of the step S20 all the manufactured article identification numbers are picked up and made the #c (Yes in the step S20), end the procedure.

Thus the manufactured article trace information for the manufactured article name #a firstly specified results in being made in the manufactured article trace information memory unit 78. Similarly, if specifying another name as a manufactured article name, the manufactured article trace information can be made for manufactured articles with another name. And according to information memorized in the manufactured article trace information memory unit 78, a manufacturing lot identification number of "component/material" used can be controlled for each product manufactured.

VARIATION EXAMPLE OF EMBODIMENT

In the embodiment thus described is not used the purchase lot trace information memory unit 79 (see FIG. 2). The purchase lot trace information memory unit 79 is used in a variation example of an embodiment described below.

Figures 9, 10:
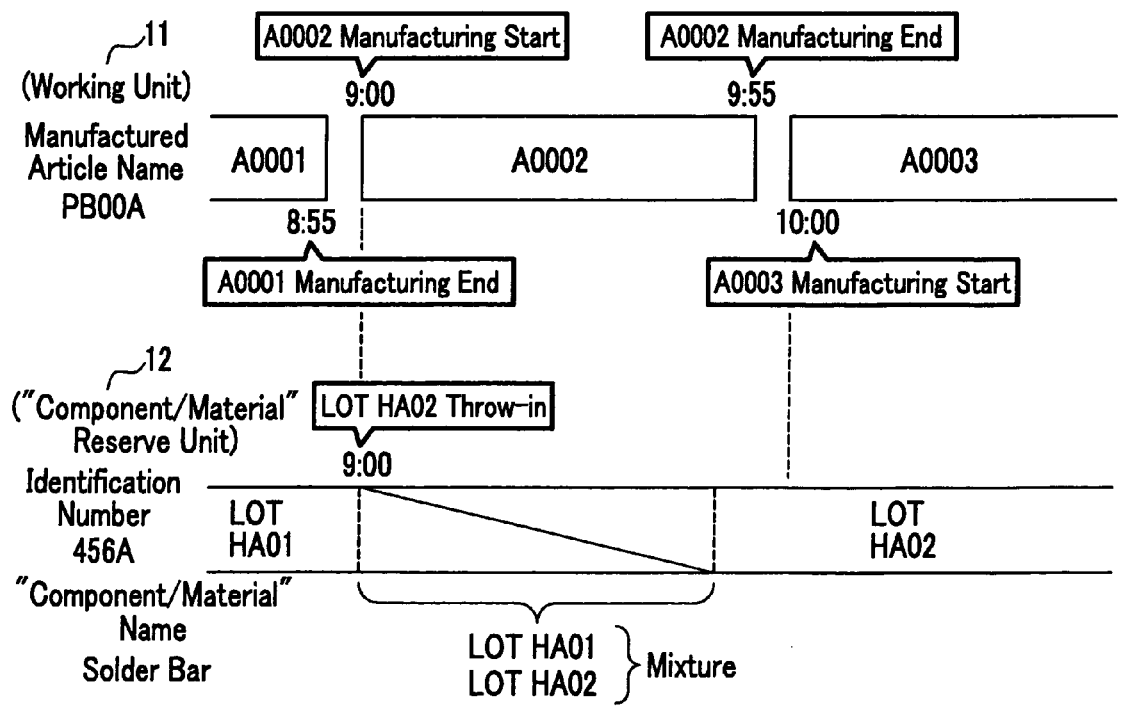
FIG. 9 is a drawing showing a configuration example of records memorized in a purchase lot trace information memory unit in a variation example of an embodiment of the present invention.
FIG. 10 is a drawing exemplifying a time chart of a manufacturing procedure of an electronic circuit board when the present invention is applied to a flow soldering process.

FIG. 9 is a drawing showing a configuration example of records memorized in the purchase lot trace information memory unit 79 in a variation example of the embodiment. In FIG. 9 a record of the purchase lot trace information memory unit 79 is constituted of fields comprising a purchase lot identification number 791, a "component/material" name 792, and a manufacturing lot identification number 793, respectively. Here, a purchase lot means a set of "component/material" in a purchase unit purchased from a "component/material" manufacturer. Accordingly, there are many cases that any of an order form number and a purchase form number is used as a purchase lot identification number.

The purchase lot identification number and the manufacturing lot identification number do not always correspond to each other. Consequently, in the purchase lot trace information memory unit 79 the purchase lot identification number is made to correspond to the manufacturing lot identification number. For example, in a second record of FIG. 9 a purchase lot identification number PO1002 of "component/material" with the "component/material" IC001 corresponds to the manufacturing lot identification number LOT012A2. Meanwhile, here is assumed that like a fourth record of FIG. 9, a plurality of manufacturing lot identification numbers can also be made to correspond to one purchase lot identification number. This signifies that "component/material" with a plurality of manufacturing lot identification numbers may be mixed in "component/material" of one purchase lot.

When generally purchasing "component/material," a barcode of a manufacturing lot identification number and the like are not always added to any of a package and containing case of the "component/material." To the package and containing case of the "component/material" is added any barcode of an order form number and purchase form number instead of a manufacturing lot identification number, and the manufacturing lot identification number is provided as additional data of the form. In such the case the purchase lot trace information memory unit 79 is made in advance, based on the additional data of the form. If so, a purchase lot identification number can be used instead of a manufacturing lot identification number in the embodiment described in FIGS. 1 to 8. If so, although information obtained as traceability information of "component/material" constituting a manufactured article is the purchase lot identification number, the number can easily be converted to the manufacturing lot identification number by using the purchase lot trace information memory unit 79.

[Application to a Case of Indefinite Shape "Component/Material"]

The "component/material" traceability control apparatus 7 in the embodiments thus described is also applicable to a case of indefinite "component/material" such as a solder. In a flow soldering process a reverse side of an electronic circuit board where components are mounted is immersed in a molten solder bath, and thereby soldering of a through hole and the like is performed. In this case the working unit 11 is the molten solder bath, and in addition, the bath doubles as the "component/material" reserve unit 12. In the molten solder bath, as new "component/material" is thrown in a solder bar every time when an amount of a molten solder decreases by a predetermined amount, in order to keep the amount of the molten solder approximately constant.

FIG. 10 is a drawing exemplifying a time chart of a manufacturing procedure of an electronic circuit board when the present invention is applied to a flow soldering process. In FIG. 10 a time chart of an upper stage is the chart showing a manufacturing of an electronic circuit board with the manufactured article name PB00A same as in the case of FIG. 3, that is, a time chart by which flow soldering is performed. For example, the flow soldering of an electronic circuit board with the manufactured article identification number A0002 is started at nine o'clock and finished at nine fifty five (actually it does not take time this much).

On the other hand, as shown in a time chart of a lower stage, in the "component/material" reserve unit 12, that is, a molten solder bath with an identification number 456A, a solder bar with a manufacturing lot identification number LOTHA02 becomes thrown in after nine o'clock, instead of a solder bar with a manufacturing lot identification number LOTHA01 being thrown in till then. In such the case a condition of a solder with the manufacturing lot identification number LOTHA01 and one with the manufacturing lot identification number LOTHA02 being mixed results in continuing some time after nine o'clock in the molten solder bath. In other words, the electronic circuit board with the manufactured article identification number A0002 results in containing as "component/material" thereof the solder bar with the manufacturing lot identification number LOTHA01 and one with the manufacturing lot identification number LOTHA02.

In the present invention, because a plurality of manufacturing lot identification numbers are made to correspond to each product manufactured, it is enabled to easily apply the embodiments described in FIGS. 1 to 8 to such the case described above. However, in order to apply the procedure shown in FIG. 8 as it is for obtaining the traceability information shown in FIG. 8, it is necessary for the "component/material" traceability control apparatus 7 not to memorize time as it is, which the manufacturing control personal computer 2 sends as "component/material" supply stop time in the "component/material" reserve unit 12, but to memorize time, where time when a mixture of "component/material" with different manufacturing lot identification numbers continues is added to the time sent by the computer 2, as information to be memorized in the field of the "component/material" supply stop time 776 of the "component/material" supply performance information memory unit 77.

In the case of FIG. 10, the "component/material" traceability control apparatus 7 memorizes in the field of the "component/material" supply stop time 776 of the "component/material" supply performance information memory unit 77 that if the condition of the solder with the manufacturing lot identification number LOTHA01 and one with the manufacturing lot identification number LOTHA02 being mixed is eliminated, for example, at nine fifty five, the supply stop time of the solder bar with the manufacturing lot identification number LOTHA01 is not at nine o'clock but nine fifty. Meanwhile, not limited to a solder within a molten solder bath, it is difficult in many cases to specify time when a mixture of "component/material" with different manufacturing lot identification numbers is actually eliminated. Consequently, in such the cases the time of the mixture elimination of the "component/material" is substituted by an expectation value obtained in advance through a numerical calculation, a simulation, and the like.

Thus also in the case of the indefinite shape "component/material," according to the procedure shown in FIG. 8, the information of the manufacturing lot trace information memory unit 78, that is, the traceability information of relevant "component/material" can be made for each product. Meanwhile, this embodiment can also be applied to control of the traceability information of a material not remaining as "component/material" of a product, for example, cleaning liquid used in a manufacturing process.

What is claimed is:

1. A component and material traceability control apparatus for controlling manufacturing lot identification information of any of a component and material constituting a product manufactured according to a process where a manufacturing apparatus with not less than one component and material reserve unit picks up a needed amount out of the component and material reserved in the component and material reserve unit and manufactures the product, said component and material traceability control apparatus at least comprising:

a processing unit;

a memory unit used as a work area by the processing unit;

a manufacturing performance information memory unit;

a component and material supply performance information memory unit; and a manufacturing lot trace information memory unit, wherein in said product manufactured by said manufacturing apparatus, information of manufacturing start time and end time according to the manufacturing apparatus is made to correspond to manufacturing apparatus identification information of said manufacturing apparatus and manufactured article identification information added to said product and is memorized in said manufacturing performance information memory unit;

wherein in the component and material reserve unit of said manufacturing apparatus, component and material supply start time of a supply of a predetermined component and material being started and component and material supply stop time of the supply being stopped are made to correspond to manufacturing lot identification information of the component and material, the manufacturing apparatus identification information of said manufacturing apparatus, component and material reserve unit identification information of said component and material reserve unit, and a name of the component and material supplied, and are memorized in said component and material supply performance information memory unit; and wherein in said product manufactured by said manufacturing apparatus, not less than one piece of manufacturing lot identification information of said component and material usable in said product is extracted, not less than the one piece of manufacturing lot identification information extracted is made to correspond to said manufactured article identification information and the name of said component and material, and is memorized in said manufacturing lot trace information memory unit, based on the information of the manufacturing start time and end time of said product memorized in said manufacturing performance information memory unit and the information of the component and material supply start time and end time memorized in said component and material supply performance information memory unit.

2. A component and material traceability control apparatus according to claim 1,
wherein when in the component and material reserve unit of said manufacturing apparatus, component and material supply start time of a supply of a predetermined component and material being started and component and material supply stop time of the supply being stopped are made to correspond to manufacturing lot identification information of the component and material, manufacturing apparatus identification information of said manufacturing apparatus, component and material reserve unit identification information of said component and material reserve unit, and a name of the component and material supplied, and are memorized in said component and material supply performance information memory unit, the manufacturing lot identification information is not less than one piece of manufacturing lot identification information.

3. A component and material traceability control apparatus according to claim 1 further comprising:
a purchase lot trace identification information memory unit,
wherein in said purchase lot trace identification information memory unit, purchase lot trace identification information for identifying a purchase lot of said component and material and not less than one piece of manufacturing lot identification information of the component and material contained in the purchase lot of the component and material are made to correspond to each other, and are memorized; and
wherein when in a component and material reserve unit of said manufacturing apparatus, component and material supply start time of a supply of a predetermined component and material being started and component and material supply stop time of the supply being stopped are made to correspond to manufacturing lot identification information of the component and material, manufacturing apparatus identification information of said manufacturing apparatus, component and material reserve unit identification information of said component and material reserve unit, and a name of the component and material supplied, and are memorized in said component and material supply performance information memory unit, said purchase lot identification number is memorized instead of said manufacturing lot identification information.

4. A component and material traceability control apparatus according to claim 2 further comprising:
a purchase lot trace identification information memory unit,
wherein in said purchase lot trace identification information memory unit, purchase lot trace identification information for identifying a purchase lot of said component and material and not less than one piece of manufacturing lot identification information of the component and material contained in the purchase lot of the component and material are made to correspond to each other, and are memorized; and
wherein when in a component and material reserve unit of said manufacturing apparatus, component and material supply start time of a supply of a predetermined component and material being started and component and material supply stop time of the supply being stopped are made to correspond to manufacturing lot identification information of the component and material, manufacturing apparatus identification information of said manufacturing apparatus, component and material reserve unit identification information of said component and material reserve unit, and a name of the component and material supplied, and are memorized in said component and material supply performance information memory unit, said purchase lot identification number is memorized instead of said manufacturing lot identification information.

5. A component and material traceability control method in a component and material traceability control apparatus for controlling manufacturing lot identification information of any of a component and material constituting a product manufactured according to a process where a manufacturing apparatus with not less than one component and material reserve unit picks up a needed amount out of the component and material reserved in the component and material reserve unit and manufactures the product, said component and material traceability control apparatus comprising:
a processing unit;
a memory unit used as a work area by the processing unit;
a manufacturing performance information memory unit;
a component and material supply performance information memory unit; and
a manufacturing lot trace information memory unit,
wherein said component and material traceability control method comprising the steps of:
making information of manufacturing start time and end time according to the manufacturing apparatus correspond to manufacturing apparatus identification information of said manufacturing apparatus and manufactured article identification information added to said product and memorizing in said manufacturing performance information memory unit in said product manufactured by said manufacturing apparatus;
making component and material supply start time of a supply of a predetermined component and material being started and component and material supply stop time of the supply being stopped correspond to manufacturing lot identification information of the component and material, manufacturing apparatus identification information of said manufacturing apparatus, component and material reserve unit identification information of said component and material reserve unit, and a name of the component and material supplied, and memorizing the component and material supply start time and end time in said component and material supply performance information memory unit in the component and material reserve unit of said manufacturing apparatus; and
extracting not less than one piece of manufacturing lot identification information of said component and material usable in said product, making not less than the one piece of manufacturing lot identification information extracted correspond to said manufactured article identification information and the name of said component and material, and memorizing the manufacturing lot identification information in said manufacturing lot trace information memory unit, based on the information of the manufacturing start time and end time of said product memorized in said manufacturing performance information memory unit and the information of the component and material supply start time and end time memorized in said component and material supply performance information memory unit in said product manufactured by said manufacturing apparatus.

6. A component and material traceability control method according to claim 5,
wherein when in the component and material reserve unit of said manufacturing apparatus, said component and material traceability control apparatus makes component and material supply start time of a supply of a predetermined component and material being started and component and material supply stop time of the supply being stopped correspond to manufacturing lot identification information of the component and material, manufacturing apparatus identification information of said manufacturing apparatus, component and material reserve unit identification information of said component and material reserve unit, and a name of the component and material supplied, and memorizes the component and material supply start time and end time in said component and material supply performance information memory unit, the manufacturing lot identification information is not less than one piece of manufacturing lot identification information.

7. A component and material traceability control apparatus according to claim 5 that further comprises a purchase lot trace identification information memory unit, makes purchase lot trace identification information for identifying a purchase lot of said component and material and not less than one piece of manufacturing lot identification information of the component and material contained in the purchase lot of the component and material correspond to each other, and memorizes them in the purchase lot trace identification information memory unit; and
when the component and material traceability control apparatus makes component and material supply start time of a supply of a predetermined component and material being started and component and material supply stop time of the supply being stopped correspond to manufacturing lot identification information of the component and material, manufacturing apparatus identification information of said manufacturing apparatus, component and material reserve unit identification information of said component and material reserve unit, and a name of the component and material supplied, and are memorized in said component and material supply performance information memory unit, the component and material traceability control apparatus memorizes said purchase lot identification number instead of said manufacturing lot identification information in the component and material reserve unit of said manufacturing apparatus.

8. A component and material traceability control apparatus according to claim 6 that further comprises a purchase lot trace identification information memory unit, makes purchase lot trace identification information for identifying a purchase lot of said component and material and not less than one piece of manufacturing lot identification information of the component and material contained in the purchase lot of the component and material correspond to each other, and memorizes them in the purchase lot trace identification information memory unit; and
when the component and material traceability control apparatus makes component and material supply start time of a supply of a predetermined component and material being started and component and material supply stop time of the supply being stopped correspond to manufacturing lot identification information of the component and material, manufacturing apparatus identification information of said manufacturing apparatus, component and material reserve unit identification information of said component and material reserve unit, and a name of the component and material supplied, and are memorized in said component and material supply performance information memory unit, the component and material traceability control apparatus memorizes said purchase lot identification number instead of said manufacturing lot identification information in the component and material reserve unit of said manufacturing apparatus.

9. A component and material traceability control program according to claim 5 that is a program for making a computer run a traceability control method.

10. A component and material traceability control program according to claim 6 that is a program for making a computer run a traceability control method.

11. A component and material traceability control program according to claim 7 that is a program for making a computer run a traceability control method.

12. A component and material traceability control program according to claim 8 that is a program for making a computer run a traceability control method.

13. A memory medium of a component and material traceability control program, wherein the program according to claim 9 is memorized in a computer-readable memory medium.

14. A memory medium of a component and material traceability control program, wherein the program according to claim 10 is memorized in a computer-readable memory medium.

15. A memory medium of a component and material traceability control program, wherein the program according to claim 11 is memorized in a computer-readable memory medium.

16. A memory medium of a component and material traceability control program, wherein the program according to claim 12 is memorized in a computer-readable memory medium.

* * * * *